United States Patent [19]

Norman

[11] 4,063,180
[45] Dec. 13, 1977

[54] NOISE DETECTING CIRCUIT

[75] Inventor: Stanley R. C. Norman, Brockville, Canada

[73] Assignee: GTE Automatic Electric (Canada) Ltd., Brockville, Canada

[21] Appl. No.: 731,402

[22] Filed: Oct. 12, 1976

[51] Int. Cl.² .......................................... H03K 5/20
[52] U.S. Cl. .................................. 328/112; 328/167; 307/234
[58] Field of Search ........................... 328/111–116, 328/151, 167, 108; 325/323; 307/265, 234

[56] References Cited

U.S. PATENT DOCUMENTS

| | | | |
|---|---|---|---|
| 3,555,435 | 1/1971 | Sheen | 328/112 |
| 3,818,358 | 6/1974 | Russell | 328/112 |
| 3,831,039 | 8/1974 | Henschel | 328/112 |

Primary Examiner—Stanley D. Miller, Jr.
Assistant Examiner—B. P. Davis

[57] ABSTRACT

A noise detecting circuit for a data processing channel operates on incoming noise pulses and trains of data pulses, each train of which is preceded by a start pulse of a duration substantially greater than the characteristic duration of a noise pulse. The noise detecting circuit generates a noise verification pulse in response to a first incoming pulse after a predetermined interval of time following the receipt of the first incoming pulse, which interval is greater than the characteristic duration of a noise pulse and less than the duration of a start pulse. Consequently, there is time coincidence between the noise verification pulse and the first incoming pulse if the first incoming pulse is a start pulse but there is no time coincidence between the noise verification pulse and the first incoming pulse if the first incoming pulse is a noise pulse. Means are included for detecting such non-coincidence and for generating an inhibit signal to indicate that the first incoming pulse is a noise pulse and to inhibit a data processing channel from processing the next incoming pulse.

10 Claims, 17 Drawing Figures

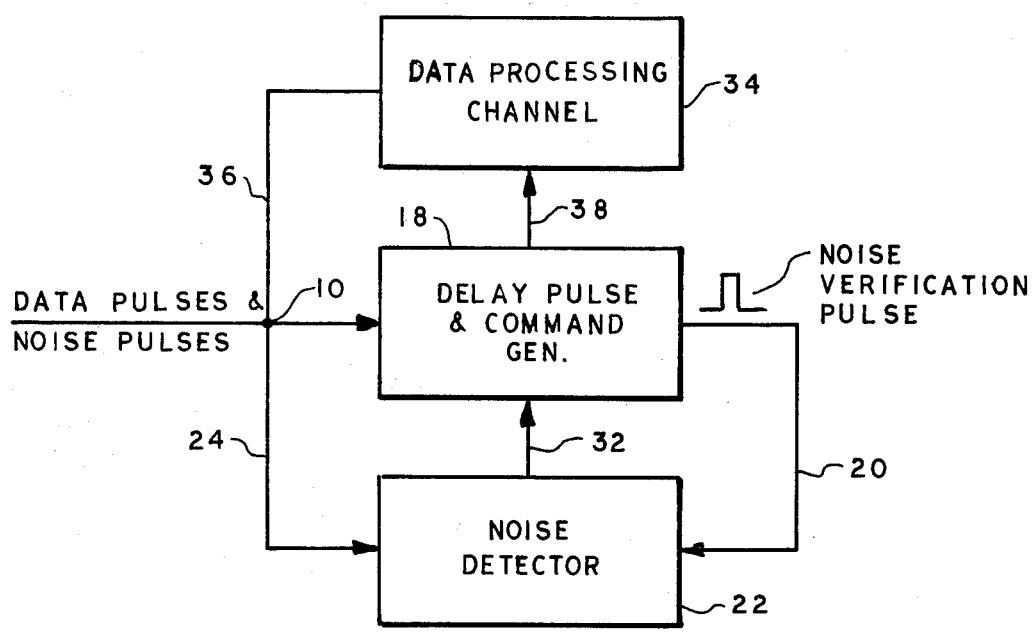
FIG. 1
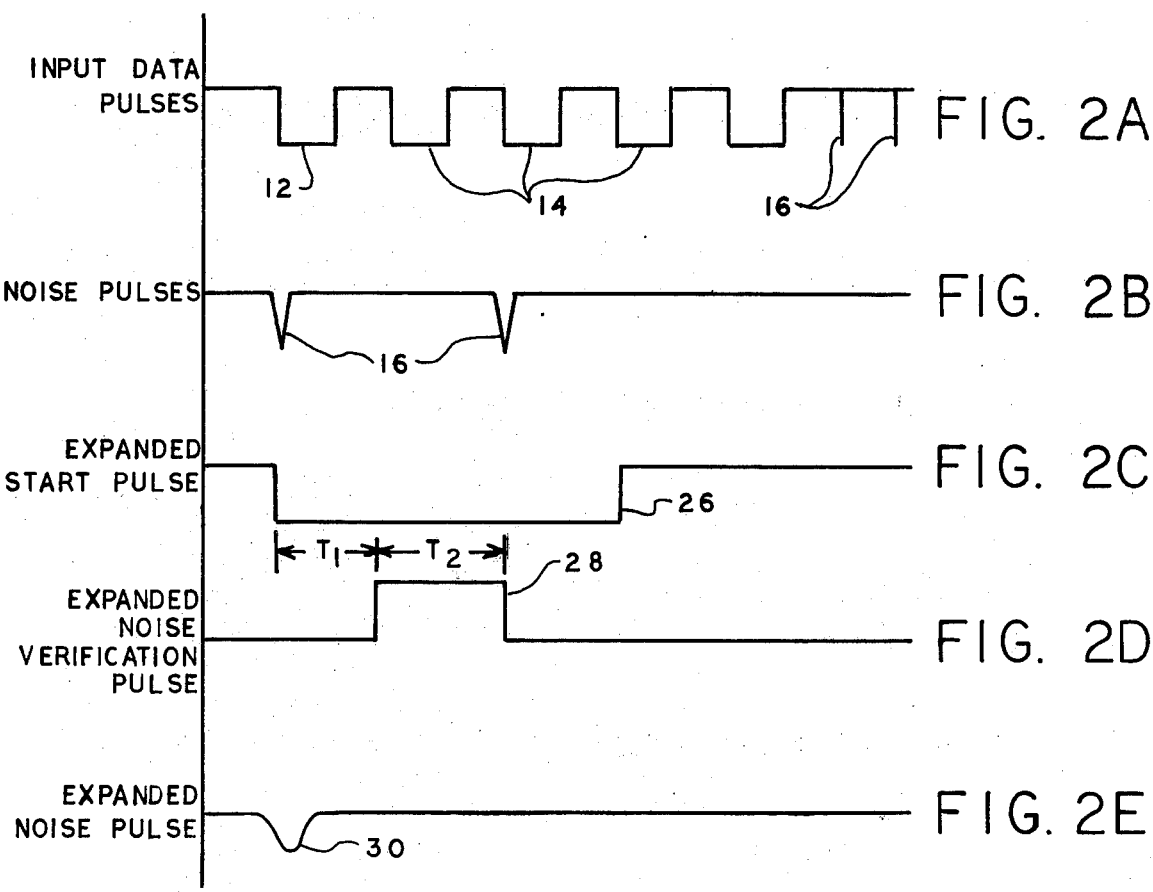
FIG. 2A
FIG. 2B
FIG. 2C
FIG. 2D
FIG. 2E

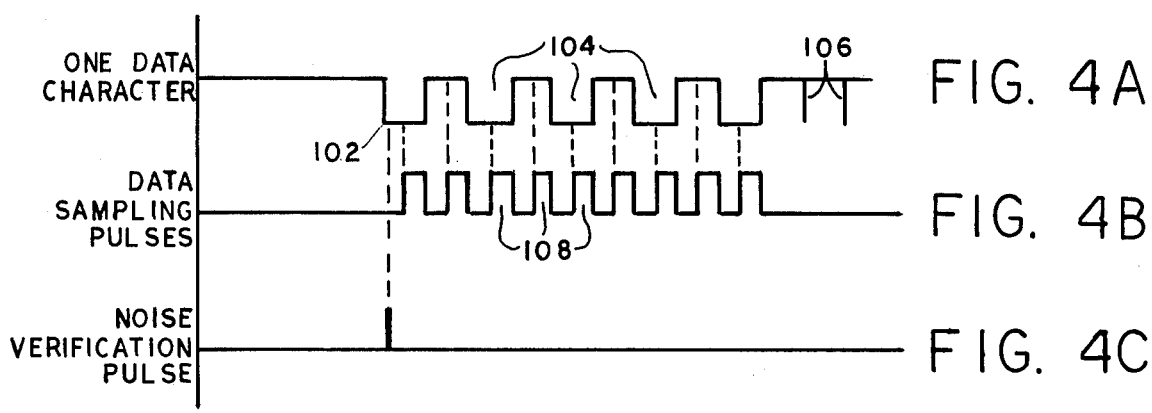
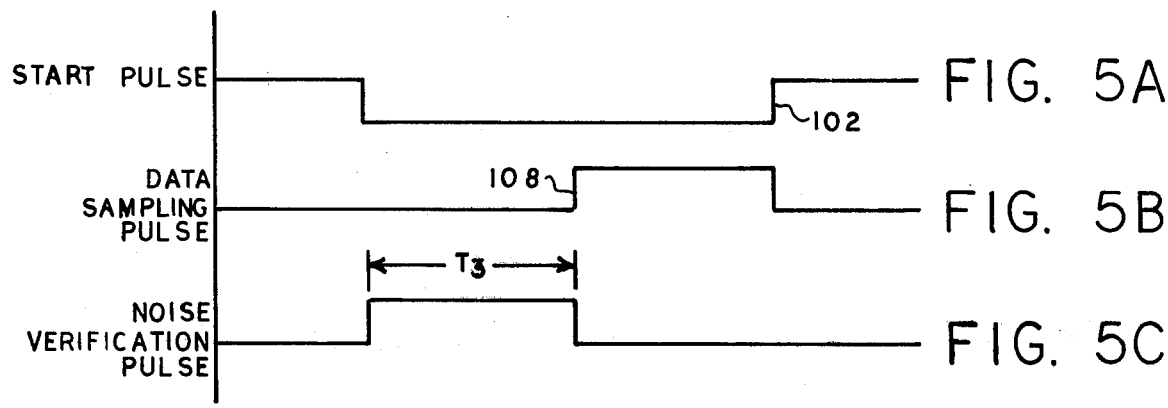
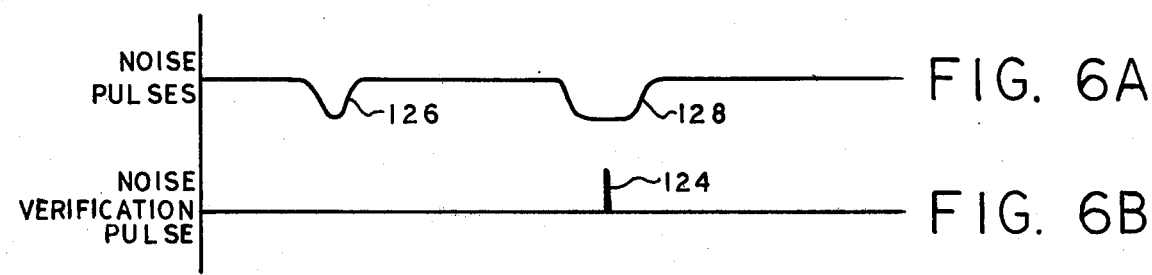
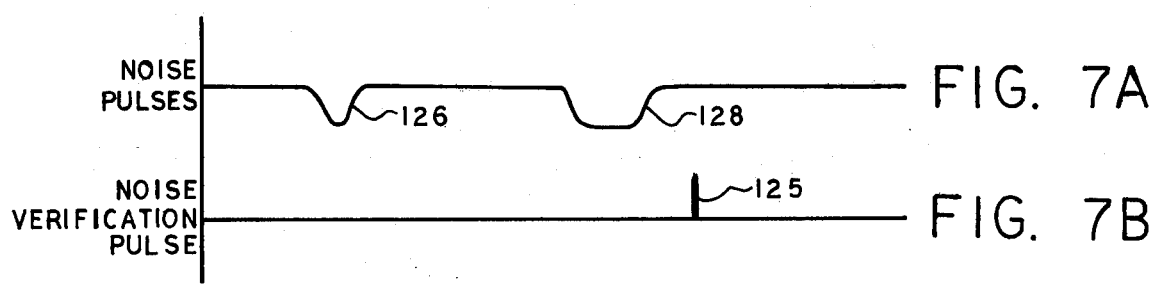

NOISE DETECTING CIRCUIT

BACKGROUND OF THE INVENTION

This invention relates generally to electrical circuits for discriminating between noise and a desired electrical signal. More particularly, this invention is directed to an electrical circuit for receiving a train of data pulses and any accompanying noise pulses and for identifying a first incoming pulse as either a noise pulse or the beginning of a train of data pulses.

In information systems which operate on trains of data pulses, i.e., data "characters," such characters may be in the form of a series of pulses preceded by a "start" pulse and followed by one or more "stop" pulses. Each character may thus be operated on as a unit since the start and finish of each character is clearly identified by the presence of start and stop pulses. However, when noise pulses accompany the data characters, the system may mistakenly identify a noise pulse as a start pulse. Such mistaken identification of a noise pulse as a start pulse may undesirably open a data processing channel to the reception of further noise pulses rather than maintain the data processing channel in a closed condition as it would be if the noise pulse had been correctly identified as noise.

OBJECTS OF THE INVENTION

It is a general object of this invention to provide improved noise discriminating circuitry for pulse information systems.

It is a more specific object of this invention to provide circuitry for discriminating between a true start pulse in a train of data pulses and a noise pulse which can be mistakenly identified as a start pulse.

BRIEF DESCRIPTION OF THE DRAWINGS

These and other objects of the invention are more particularly set forth in the following detailed description and in the accompanying drawings of which:

FIG. 1 is a general block diagram of a noise detecting circuit embodying the invention;

FIGS. 2a-2e illustrate waveforms useful in describing the operation of the FIG. 1 circuit;

FIGS. 4a-4c, 5a-5c, 6a-6b and 7a-7b illustrate waveforms useful in describing the operation of the circuit shown in FIG. 3.

DESCRIPTION OF THE PREFERRED EMBODIMENT

Figure 3:
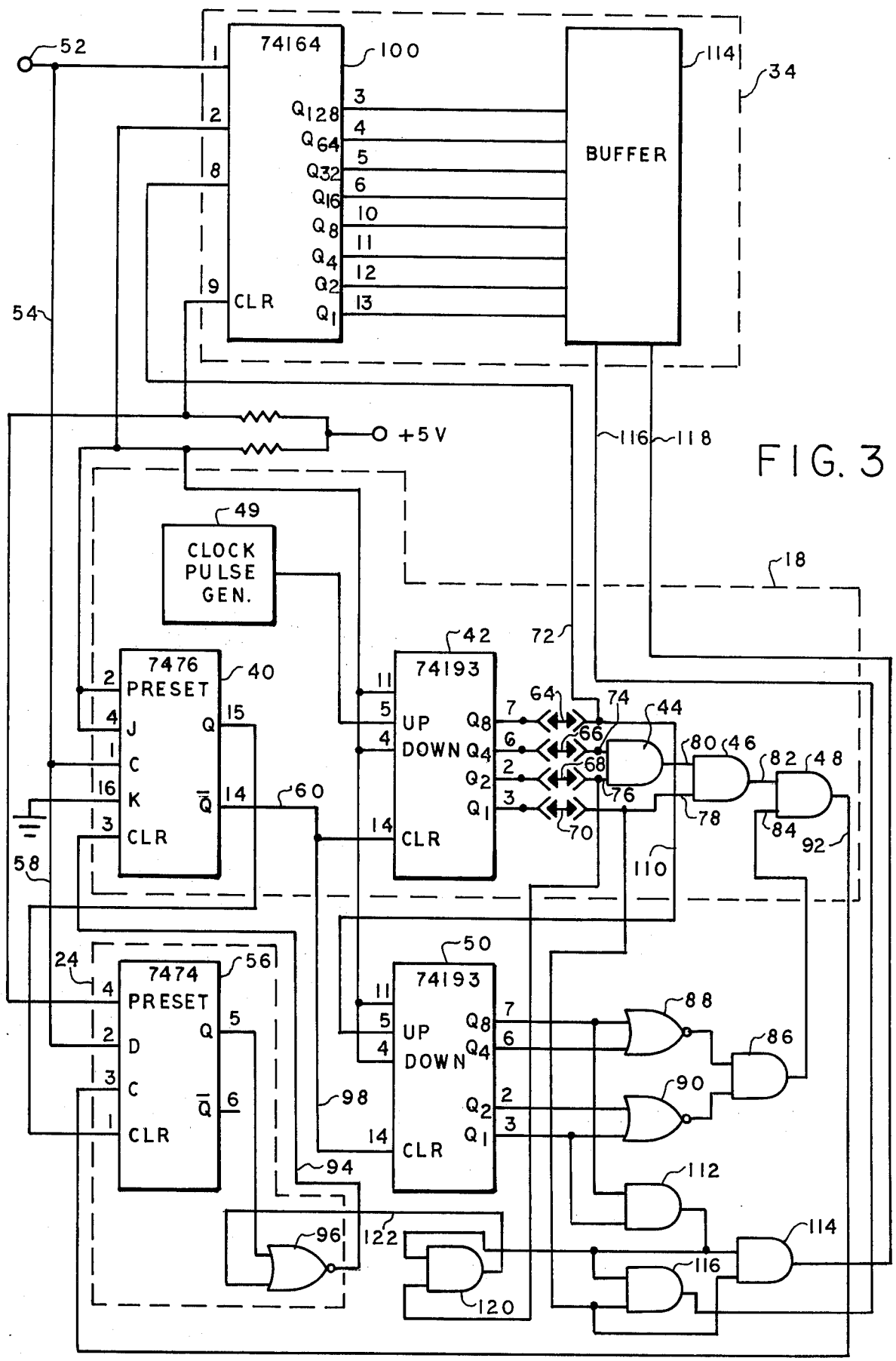
FIG. 3 is a schematic diagram illustrating a specific exemplary circuit which performs the functions of the more general circuit of FIG. 1.

Broadly stated, this invention provides a noise detecting circuit which receives data characters, each of which begins with a start pulse, and accompanying noise pulses and distinguishes the start pulses from the noise pulses. The start pulses have a known duration which is generally longer than the characteristic duration of the noise pulses and this difference in duration is used herein to identify a received pulse as either a start pulse or a noise pulse.

In an embodiment described herein, a first electrical circuit receives noise pulses and trains of data pulses, each train including a start pulse, and generates a noise verification pulse after a predetermined interval following the receipt of a first incoming start pulse or noise pulse. The predetermined interval preceding the generation of a noise verification pulse is selected to be longer than the characteristic duration of a noise pulse but shorter than the known duration of a start pulse. Because a noise pulse which causes the generation of an associated noise verification pulse will have ended prior to the generation of the noise verification pulse, there will be no time coincidence between the noise pulse and its associated noise verification pulse.

A second electrical circuit receives the first incoming pulse and the associated noise verification pulse and generates an electrical signal indicative of a lack of time coincidence between the first incoming pulse and the noise verification pulse when the first incoming pulse is a noise pulse, thereby properly identifying the first incoming pulse as a noise pulse rather than a start pulse.

In the case where the first incoming pulse is a start pulse, the second electrical circuit may generate an electrical indication of time coincidence between the incoming start pulse and the associated noise verification pulse, thereby correctly identifying the first incoming pulse as a start pulse.

The electrical signal which indicates that a first incoming pulse is a noise pulse is used in an illustrated embodiment to inhibit a data processing channel from processing pulses which are received subsequent to the reception of a pulse which is identified as a noise pulse. This insures that the only received pulses which are processed are those which follow a pulse which has been identified as a start pulse.

Referring now to FIG. 1, there is shown in schematic form a general embodiment of this invention which operates as described above. An input terminal 10 receives a train of data pulses such as that shown in FIG. 2A. Each train of pulses typically includes a start pulse 12 followed by a series of data pulses 14. The end of the train of pulses is identified by a pair of stop pulses 16.

Although the illustrated embodiment is specifically designed to operate on a train of pulses such as that shown in FIG. 2A, the invention in general is not so limited. However, each train of pulses should at least have an identifiable start pulse having a known minimum duration.

Also occasionally present at the input terminal 10 are noise pulses such as pulses 16 shown in FIG. 2B. The noise pulses 16 may be superimposed on the input data pulses 12, 14 and 16 or may appear between trains of data pulses. It is the noise pulses 16 which appear between trains of data pulses which are of primary concern herein and which can give a false indication of start pulses if not correctly identified as noise pulses.

Referring again to FIG. 1, the data pulses and noise pulses appearing at the input terminal 10 are coupled to a first electrical circuit 18 which is identified functionally as a delay pulse and command generator. Upon receipt of a first pulse which may be either a noise pulse or a start pulse, and after a predetermined time delay, the generator 18 produces at its output lead 20 a noise verification pulse. The predetermined time delay or time interval which exists between the receipt of a first start or noise pulse and the generation of a noise verification pulse is greater than the characteristic duration of a noise pulse but less than the known duration of a start pulse. Accordingly, if a noise pulse causes the generation of an associated noise verification pulse by the delay pulse and command generator 18, the noise pulse will have terminated prior to the generation of its associated noise verification pulse.

The output terminal 20 couples the noise verification pulse to a noise detector 22 which also receives the associated noise or start pulse via lead 24. Exemplary pulses which are received by the noise detector 22 are illustrated in FIGS. 2C, 2D and 2E.

If a noise verification pulse were generated in response to a start pulse, the noise detector 22 would receive the start pulse 26 of FIG. 2C and the noise verification pulse 28 of FIG. 2D. The noise detector 22 then looks for time coincidence between its received pulses and, finding such time coincidence, identifies the pulse received at lead 24 as a start pulse. As indicated in FIGS. 2C and 2D, the noise verification pulse 28 is generated after an interval $T_1$ following the leading edge of the start pulse 26 and an interval of time coincidence $T_2$ exists between the start pulse 26 and the noise verification pulse 28. It is this time coincidence between received pulses which the noise detector 22 detects in order to identify a pulse received at lead 24 as a start pulse.

In the case where a noise verification pulse is generated in response to the receipt by the generator 18 of a noise pulse, the inputs to the noise detector 22 are the noise verification pulse 28 of FIG. 2D and the noise pulse 30 of FIG. 2E. It is clear from FIGS. 2D and 2E that there is no time coincidence or time overlap between the noise verification pulse 28 and its associated noise pulse 30. Accordingly, the noise detector 22 detects this lack of time coincidence between its received pulses and generates at its output lead 32 an electrical signal indicative of the lack of time coincidence between the noise verification pulse and its associated noise pulse, thereby properly identifying the received pulse from input terminal 10 and lead 24 as a short duration noise pulse rather than a start pulse.

The electrical signal appearing on lead 32 is used, as described below, to inhibit a data processing channel from processing received pulses which are not preceded by a true start pulse. Such a data processing channel is shown at 34 in FIG. 1.

The data processing channel 34 receives data and noise pulses from the input terminal 10 via lead 36 and processes the received pulses only upon receipt of a command signal on lead 38 from the delay pulse and command generator 18. Preferably, the delay pulse and command generator 18 is programmed to deliver a command signal to the data processing channel 34 at a predetermined interval after generating a noise verification pulse. During this predetermined interval, the noise detector 22 is determining whether a received pulse is a noise pulse or a start pulse. If a start pulse is identified, no electrical signal is sent to the delay pulse generator 18 to inhibit its generation of a command signal. When the predetermined interval has expired without the delay pulse and command generator 18 having received a signal on lead 32, the delay pulse and command generator 18 will send a command signal to the data processing channel 34 commanding it to process its received pulses. If the noise detector 22 identifies a received pulse as a noise pulse, it will inhibit the generation of a command pulse by the delay pulse and command generator 18 and the data processing channel 34 will remain closed.

It will be appreciated that the circuit illustrated in FIG. 1 will properly identify noise pulses as such and will inhibit a data processing channel from operating on undesired pulses. The only pulses which will be accepted for processing are those which have been first identified by an initial start pulse.

Specific exemplary circuitry which performs the functions associated with the FIG. 1 device and which includes various other aspects of this invention is shown in FIG. 3, to which reference is now made. As shown in FIG. 3, groups of circuit elements have been enclosed in dashed lines and labeled with reference numerals corresponding to numerals used in FIG. 1. Such correspondingly numbered circuit elements perform similar functions. FIG. 3 also includes a number of elements which provide functions other than those described with reference to FIG. 1 in order to demonstrate a particular application of the invention.

In addition, some circuit elements are identified by their commercial part numbers with their pin numbers and standard input/output symbols shown where applicable.

The delay pulse and command generator 18 is shown as including a flip-flop 40, a counter 42, AND gates 44, 46 and 48, and a clock pulse generator 49. Initially, the counter 42 is in a quiescent condition (not counting) with its outputs $Q_1$, $Q_2$, $Q_4$ and $Q_8$ at logic 0. A counter 50, about which more will be said below, also has a logic 0 at each of its outputs $Q_1$, $Q_2$, $Q_4$ and $Q_8$ when in a quiescent condition.

Initially, a start pulse such as pulse 12 of FIG. 2A or a noise pulse such as pulse 30 of FIG. 2E will be received at an input terminal 52 and applied to pin 1 of the flip-flop 40 via lead 54. Any input pulse appearing on lead 54 is also conducted to a bistable device 56 (shown herein as a flip-flop) via conductor 58.

When the flip-flop 40 receives a pulse at pin 1 it becomes "set" and delivers at its pin 14 a signal which is applied to the counter 42 via conductor 60. The signal applied to pin 14 of the counter 42 causes the counter 42 to begin counting clock pulses which it receives from the clock pulse generator 49. The clock pulse generator 49 generates a periodic train of clock pulses having a frequency of 76.80 KH$_z$.

The counter 42 has four outputs labeled $Q_1$, Qhd 2, $Q_4$ and $Q_8$, each of which exhibits a logic 1 level when the counter 42 reaches a count corresponding to the clock frequency divided by $2n$, where $n = 1, 2, 4$ or 8. For example, $Q_1$ reaches a logic level 1 when the counter 42 counts 2 clock pulses, $Q_2$ reaches a logic level 1 when the counter 42 counts 4 clock pulses, etc.

The various outputs of the counter 42 are shown as being connectable in a variety of combinations by means of straps 64, 66, 68 and 70. For purposes of discussion, it is assumed that the straps 64–70 connect the nearest adjacent terminals such that counter output $Q_8$ is connected to lead 72, counter output $Q_4$ is connected to an input terminal 74 of the AND gate 44, counter output $Q_2$ is connected to an input terminal 76 of the AND gate 44, and counter output $Q_1$ is connected to an input terminal 78 of the AND gate 46. By providing the straps 64, 66, 68 and 70, the AND gates 44 and 46 can be connected to selected outputs of the counter 42 to sense various output states. The reason for providing means for selecting various output states of counter 42 is explained below following an over-all explanation of the operation of the FIG. 3 circuitry.

When the counter 42 is enabled by the signal provided on lead 60 from the flip-flop 40, it begins counting the clock pulses provided by the clock pulse generator 49. When the counter 42 reaches a count which causes a logic level 1 to appear at outputs $Q_1$, $Q_2$ and $Q_4$, both inputs to the AND gate 44 will be high. The high inputs to the AND gate 44 result in a high output being generated by the AND gate 44, which high output is applied to an input terminal 80 of the AND gate 46. Since the $Q_1$ output of the counter 42 is already high, the and gate 46 has high inputs at both input terminals 78 and 80 and generates a high output which is applied to an input terminal 82 of the AND gate 48. Another input terminal 84 of the AND gate 48 is also high because of the high output generated by an AND gate 86 whenever the outputs $Q_1$, $Q_2$, $Q_4$ and $Q_8$ of the counter 50 are at a low or 0 logic level. The presence of a low logic level on all outputs of the counter 50 is sensed by NOR gates 88 and 90 which drive the AND gate 86.

The preceding sequence of events results in a pair of high inputs being applied to the input terminals 82 and 84 of the AND gate 48 in response to the flip-flop 40 receiving a first input pulse and the counter 42 counting up to a first predetermined count, as indicated by high logic levels at its output terminals $Q_1$, $Q_2$ and $Q_4$. In response to its high inputs, the AND gate 48 generates a high output which appears on lead 92 and which corresponds to the noise verification pulse referred to in connection with FIGS. 1 and 2D. Accordingly, the high logic level appearing on lead 92 is referred to herein as a noise verification pulse.

The high logic level noise verification pulse on lead 92 is applied to the clock input (pin 3) of the flip-flop 56 to clock in the logic state appearing at its input data terminal (pin 2). If the originally received pulse on leads 54 and 58 had been a noise pulse which started the abovedescribed sequence of events, that noise pulse will have disappeared prior to the receipt of the noise verification pulse by the flip-flop 56. In that case, the noise verification pulse will cause the flip-flop 56 to set and thereby reset the flip-flop 40 via a lead 94 and a NOR gate 96. The resetting of the flip-flop 40 in turn causes the counter 42 to be reset by virtue of a reset signal on lead 60 and causes the counter 50 to be reset by virtue of the same reset signal on lead 98, thereby returning both the counters 42 and 50 to their idle states in which their outputs are at a low logic level (the function of the counter 50 will be described below).

With the outputs of the counter 42 now at a low logic level, the noise verification pulse at lead 92 is terminated by virtue of the operation of the AND gates 44, 46 and 48.

The above-described sequence of events includes the reception of a noise pulse at the input terminal 52 and at flip-flop 40, the initiation of a counting cycle by the counter 42 up to a first predetermined count, the generation of a noise verification pulse on lead 92 when the counter 42 reaches a first predetermined count, and the identification by the circuitry 24 of the received pulse as a noise pulse. The identification of the received pulse as a noise pulse caused the counter 42 to stop counting and to be reset to 0 at all outputs. If the counter 42 had not been caused to stop counting, its count would have eventually reached a second higher predetermined count represented by a high logic level at output $Q_8$.

A high logic level at output $Q_8$ corresponds to the command signal on lead 38 of FIG. 2 and is applied to pin 8 of a shift register 100 to clock a received pulse from the input terminal 52 into the shift register 100. However, the counter 42 is not permitted to reach the second predetermined high count when the circuitry 24 identifies a received pulse as a noise pulse. Therefore, the $Q_8$ output of the counter 42 will not go high and the received pulse at the input termianl 52 will not be clocked into the shift register 100 when a received pulse is identified as a noise pulse. In this way, no part of a noise pulse can pass through the data processing channel 34. This is an advantage over systems using only filters to remove noise pulses since an edge of a large amplitude noise pulse may pass through a filter and actuate an edge triggerable data processing channel.

The operation of the FIG. 3 circuitry will now be described for the situation which exists when a true start pulse is received at the input terminal 52. Upon receipt of a true start pulse by the flip-flop 40, the counter 42 is actuated and counts up to the first predetermined count as previously described. Upon reaching the first predetermined count (high logic levels at outputs $Q_1$, $Q_2$ and $Q_4$ of the counter 42), a noise verification pulse is generated on the lead 92 and applied to pin 3 of the flip-flop 56. To insure that there will be time coincidence between the noise verification pulse at pin 3 of the flip-flop 56 and a received start pulse at pin 2 of the flip-flop 56, the first predetermined count which is sensed by the AND gates 44 and 46 will always be reached prior to the end of a received start pulse; that is, the time interval between the receipt of a pulse and the generation of a noise verification pulse is less than the duration of a start pulse.

When the flip-flop 56 senses the simultaneous presence of the noise verification pulse at its pin 3 and a start pulse at its pin 2, it will not become set and will not, in turn, reset the flip-flop 40. Because the flip-flop 40 is not reset, the counter 42 does not receive a reset signal via lead 60 and continues to count toward its second higher predetermined count.

Upon reaching the second higher predetermined count, the counter 42 generates a high output at $Q_8$ and this high output in turn clocks in the start pulse to the shift register 100. Following the initial clocking in of a start pulse to the shift register 100, the counter 42 continues to periodically generate high logic levels at its $Q_8$ output to clock into the shift register 100 the data pulses which follow a start pulse.

As indicated hereinbefore and as illustrated in FIG. 4A, each character or train of data pulses may include a start pulse 102 followed by a periodic train of data pulses 104 and a pair of stop pulses 106. The high logic levels which are periodically generated at the $Q_8$ output of the counter 42 are referred to herein as data sampling pulses and are numbered 108 in FIG. 4B. In the illustrated embodiment of FIG. 3, these data sampling pulses 108 occur nine times for each new character which is received at the output terminal 52 and cause the data pulses 104 to be sampled in the shift register 100 at the times indicated in FIGS. 4A and 4B. The sampled data pulses appear at the output terminals $Q_1$, $Q_2$, $Q_4$, $Q_8$, $Q_{16}$, $Q_{32}$, $Q_{64}$ and $Q_{128}$ of the shift register 100.

The start pulse 102 becomes shifted out of the shift register 100 and the two stop pulses 106 are not sampled. FIG. 4C illustrates a noise verification pulse and is included to demonstrate the time relationship among the various pulses.

In order to insure that the shift register 100 samples only a predetermined number of pulses and does not continue to sample an input at terminal 52 after a complete character has been sampled, the counter 50 counts the number of data sampling pulses 108 in order to discontinue the sampling process after nine data sampling pulses have been generated (corresponding to the sampling of one complete data character). Toward that end, the data sampling pulses 108 are conducted from the $Q_8$ output of the counter 42 via a lead 110 to pin 5 of the counter 50. Each data sampling pulse is counted by the counter 50 and, when a count of nine is reached, this condition is sensed by an AND gate 112. Upon sensing a count of nine, the AND gate 112 actuates AND gates 114 and 116 which, in turn, enable a buffer 114 via leads 116 and 118. The buffer 114 then accepts the character appearing at the output terminals of the shift register 100.

After the above-described sequence of events has occurred, an AND gate 120 generates a high level logic signal on lead 122. The high level logic on lead 122 is received by the NOR gate 96 which then resets the flip-flop 40. The resetting of the slip-flop 40 causes the entire circuit to revert to the idle condition to accept and identify a new start pulse or noise pulse.

As was briefly alluded to hereinabove, a number of straps 64, 66, 68 and 70 have been provided for making a variety of connections between the outputs of the counter 42 and the inputs to the AND gates 44 and 46. Providing means for selecting various combinations of outputs from the counter 42 permits the time at which the noise verification pulse is generated to be varied. For example, if AND gates 44 and 46 are connected to outputs $Q_1$ and $Q_2$ rather than to $Q_1$, $Q_2$ and $Q_4$, the noise verification pulse will be generated sooner than the one generated when the straps 66, 68 and 70 connect outputs $Q_1$, $Q_2$ and $Q_4$ to the AND gates 44 and 46.

The interval within which the generation of a noise verification pulse can be varied is shown in FIG. 5C as the interval $T_3$. FIGS. 5a and 5b illustrate an expanded start pulse 102 and a data sampling pulse 108 and the time relationship which exists among the illustrated pulses. The circuitry illustrated in FIG. 3 can be modified by means of the strapping options provided by straps 64, 66, 68 and 70 to vary the time at which the noise verification pulse is generated anywhere within the interval T3. The desirability of providing means for varying the time at which the noise verification pulse is generated can be appreciated by referring to FIG. 6A which illustrates a first noise pulse 126 followed by a second noise pulse 128.

If noise pulse 126 is the first received pulse, a noise verification pulse 124 will be generated after a predetermined interval of time following the receipt of the noise pulse 126. Because the noise verification pulse is not generated until a predetermined time following the receipt of the noise pulse 126, the noise verification pulse 124 may occur during the receipt of the second subsequent noise pulse 128. This condition is illustrated in FIG. 6B. Should the noise verification pulse 124 occur when a second subsequent noise pulse 128 is received, the first noise pulse 126 will be improperly identified as a start pulse and the data processing channel 34 will be commanded to process the noise pulse 128.

There are environments in which one can predict the occurrence of a second noise pulse at a known time following a first noise pulse. An example of such a situation is where a teletypewriter forms an input to the circuitry of FIG. 3. The bounce of a teletypewriter key may generate a pair of pulses which are separated by a known time interval. In such cases it is desirable to generate the noise verification pulse at a point in time which does not correspond to the time when the second noise pulse will occur.

By taking advantage of the strapping options provided in FIG. 3 (straps 64, 66, 68 and 70), the time at which a noise verification pulse is generated can be varied and be made to occur as shown in FIGS. 7A and 7B. Even though the noise pulse 126 of FIG. 7A causes a noise verification pulse 125 to be generated, the noise verification pulse 125 has been positioned so that it does not occur during the presence of the second noise pulse 128. The time at which a noise verification pulse is generated can be tailored to a particular environment so that a noise verification pulse which is generated in response to the receipt of a first noise pulse will not occur during the receipt of a subsequent noise pulse and will not therefore improperly identify the first noise pulse as a start pulse.

In accordance with the above stated objectives of this invention, the circuitry described herein provides an improved noise discriminator for identifying a received pulse as either a start pulse or a noise pulse. When a received pulse is identified as a noise pulse, a data processing channel is inhibited from processing that pulse and any successively received pulses until a true start pulse is identified.

Although a specific embodiment of this invention has been illustrated and described, the invention is not contemplated as being limited to the illustrated embodiment. For example, although the circuitry of FIG. 3 is shown as including a counter 42 which counts up to a predetermined count for enabling the data processing channel 34 unless its counting is terminated beforehand by virtue of a received pulse being identified as a noise pulse, the counter 42 may alternately be programmed to count up to that same predetermined count only when commanded to do so by the noise detector 22 identifying a received pulse as a start pulse. This and many other such variations in the illustrated embodiment will be obvious to those skilled in the art in view of this disclosure. Accordingly, all such variations and modifications are deemed to be within the spirit and scope of the invention as defined by the following claims.

What is claimed is:

1. A noise detecting circuit for a data processing channel which is adapted to receive a train of data pulses preceded by a start pulse of a known duration and noise pulses of characteristic durations less than that of the start pulse and for providing an inhibit signal to the data processing channel in response to a first incoming pulse being a noise pulse, comprising:

a first circuit responsive to a first incoming pulse for generating a noise verification pulse after a predetermined interval of time which is greater than the characteristic duration of a noise pulse and less than the duration of a start pulse;

a second circuit receiving the first incoming pulse and the noise verification pulse and responsive to a lack of time coincidence between the first incoming pulse and the noise verification pulse for generating an inhibit signal to inhibit the processing of a next incoming pulse by the data processing channel, whereby upon receipt of a first incoming pulse having a duration corresponding to that of a start pulse for a succeeding train of data pulses, the succeeding train of data pulses is coupled through the data processing channel and upon receipt of a first incoming pulse of a duration less than that of a start pulse an inhibit signal is generated in said second circuit for inhibiting the coupling of succeeding pulses through the data processing channel.

2. A noise detecting circuit as set forth in claim 1 including means for varying the time at which the noise verification pulse is generated in order to tailor the time of its generation to a particular environment so that a noise verification pulse which is generated in response to the receipt of a first noise pulse will not occur during receipt of a subsequent second noise pulse and will not therefore improperly identify the first noise pulse as a start pulse.

3. A circuit as set forth in claim 1 including means for generating clock pulses and wherein said first circuit includes a counter for counting said clock pulses upon receipt of a first incoming pulse and includes means for generating a noise verification pulse in response to said counter counting to a first predetermined count.

4. A circuit as set forth in claim 3 including a data processing channel receiving the data and noise pulses and responsive to said counter counting to a second higher predetermined count for processing the received pulses, said counter being inhibited from counting to said second higher predetermined count in response to the generation of the inhibit signal identifying a first incoming pulse as a noise pulse.

5. A circuit as set forth in claim 1 wherein said second circuit includes a bistable element have two stable output states, one of which output states corresponds to said inhibit signal.

6. A noise detecting circuit for receiving a train of data pulses including an initial start pulse of a known duration and noise pulses of characteristically shorter duration and for identifying a first incoming pulse as either a start pulse or a noise pulse, comprising:
    means for generating clock pulses;
    first circuit means including a counter receiving the data pulses, the noise pulses, and the clock pulses, said counter counting the clock pulses upon receipt of a first incoming pulse;
    means for generating a noise verification pulse in response to said counter counting to a first predetermined count, the first predetermined count being reached after an interval which is greater than the characteristic duration of a noise pulse and less than the duration of a start pulse; and
    second circuit means receiving the data pulses, the noise pulses and the noise verification pulse for providing an electrical indication of a lack of time coincidence between the first incoming pulse and the noise verification pulse when the first incoming pulse is a noise pulse, thereby identifying the first incoming pulse as a noise pulse rather than a start pulse.

7. A circuit as set forth in claim 6 wherein said second circuit means provides an electrical indication of time coincidence between a first incoming pulse and the noise verification pulse when the first incoming pulse is a start pulse, thereby identifying the first incoming pulse as a start pulse rather than a noise pulse.

8. A circuit for processing data pulses in a train of pulses including an initial start pulse of known duration and noise pulses of characteristically shorter duration and for identifying a first incoming pulse as either a start pulse or a noise pulse, comprising:
    means for generating clock pulses;
    a first circuit, including a counter, receiving the data pulses, the noise pulses and the clock pulses, said counter counting the clock pulses upon receipt by said first circuit of a first incoming pulse;
    a second circuit for generating a noise verification pulse in response to said counter counting to a first predetermined count, the first predetermined count being reached after an interval which is greater than the characteristic duration of a noise pulse and less than the duration of a start pulse;
    a third circuit receiving the data and noise pulses and the noise verification pulse for generating an electrical signal indicative of a lack of time coincidence between the noise verification pulse and the first incoming pulse when the first incoming pulse is a noise pulse, thereby identifying the first incoming pulse as a noise pulse rather than a start pulse; and
    a data processing channel receiving the data and noise pulses and responsive to said counter counting to a second higher predetermined count for processing the received pulses, said first circuit being responsive to the electrical signal generated by said third circuit for inhibiting the counter from counting to said second higher predetermined count when the first incoming pulse is a noise pulse and for permitting the counter to count to said second predetermined count when the electrical signal is not generated, thereby allowing said data processing channel to process subsequently received data pulses only when the first incoming pulse is a start pulse and inhibiting the data processing channel from processing subsequently received pulses when the first incoming pulse is a noise pulse.

9. A circuit as set forth in claim 8, including means for varying said first predetermined count to vary the time at which the noise verification pulse is generated in order to tailor the time of its generation to a particular environment so that a noise verification pulse which is generated in response to the receipt of a first noise pulse will not occur during receipt of a subsequent second noise pulse and will not therefore improperly identify the first noise pulse as a start pulse.

10. A circuit as set forth in claim 8 wherein said data processing channel includes a data pulse sampler for sampling received data pulses in response to said counter counting to said second higher predetermined count.

* * * * *